(12) United States Patent
Peapoot et al.

(10) Patent No.: US 9,537,463 B2
(45) Date of Patent: Jan. 3, 2017

(54) CHOKE AND EMI FILTER WITH THE SAME

(71) Applicant: DET International Holding Limited, George Town, Grand Cayman (KY)

(72) Inventors: Adisak Peapoot, Samutprakarn (TH); Chana Duangpitak, Samutprakarn (TH); Chin Huat Lim, Samutprakarn (TH)

(73) Assignee: DET INTERNATIONAL HOLDING LIMITED, George Town, Grand Cayman (KY)

( * ) Notice: Subject to any disclaimer, the term of this patent is extended or adjusted under 35 U.S.C. 154(b) by 134 days.

(21) Appl. No.: 14/144,238

(22) Filed: Dec. 30, 2013

(65) Prior Publication Data

US 2015/0188509 A1    Jul. 2, 2015

(51) Int. Cl.
| | | |
|---|---|---|
| H03H 7/09 | (2006.01) | |
| H01F 17/00 | (2006.01) | |
| H03H 7/42 | (2006.01) | |
| H02H 9/00 | (2006.01) | |
| H04B 3/30 | (2006.01) | |
| H03H 7/01 | (2006.01) | |

(Continued)

(52) U.S. Cl.
CPC .............. *H03H 7/427* (2013.01); *H01F 3/10* (2013.01); *H01F 27/2847* (2013.01); *H01F 27/306* (2013.01); *H02H 9/005* (2013.01); *H03H 1/0007* (2013.01); *H03H 7/0115* (2013.01); *H03H 7/09* (2013.01); *H04B 3/30* (2013.01); *H01F 2017/0093* (2013.01); *H03H 2001/005* (2013.01); *H03H 2001/0057* (2013.01)

(58) Field of Classification Search
CPC ..... H04B 3/30; H01F 2017/0093; H03H 7/09; H03H 1/0007; H03H 7/0115; H03H 7/427
USPC ... 333/4, 5, 12, 168, 181, 185; 336/184, 216
See application file for complete search history.

(56) References Cited

U.S. PATENT DOCUMENTS

| | | | |
|---|---|---|---|
| 5,422,619 A * | 6/1995 | Yamaguchi | H01F 17/04 336/181 |
| 6,624,997 B1 * | 9/2003 | Llanos et al. | 361/111 |

(Continued)

FOREIGN PATENT DOCUMENTS

| | | |
|---|---|---|
| CN | 101951140 | 1/2011 |
| CN | 203104273 | 7/2013 |
| JP | H11273975 | 10/1999 |

*Primary Examiner* — Robert Pascal
*Assistant Examiner* — Rakesh Patel
(74) *Attorney, Agent, or Firm* — Kirton McConkie; Evan R. Witt (57) ABSTRACT

A choke for an EMI filter is provided. The EMI filter includes a first filtering circuit and a second filtering circuit. The choke includes a magnetic core assembly and four winding coils. The magnetic core assembly includes a first magnetic core and a second magnetic core. The first winding coil and the second winding coil are directly wound around the first magnetic core. The third winding coil and the fourth winding coil are directly wound around the second magnetic core. The first winding coil is serially connected with a first positive path of the first filtering circuit. The second winding coil is serially connected with a second positive path of the second filtering circuit. The third winding coil is serially connected with a first negative path of the first filtering circuit. The fourth winding coil is serially connected with a second negative path of the second filtering circuit.

20 Claims, 9 Drawing Sheets

(51) Int. Cl.
*H01F 3/10* (2006.01)
*H01F 27/28* (2006.01)
*H01F 27/30* (2006.01)
*H03H 1/00* (2006.01)

(56) References Cited

U.S. PATENT DOCUMENTS

| | | | |
|---|---|---|---|
| 7,295,092 B2* | 11/2007 | Elliott | H01F 17/06 336/178 |
| 2004/0036568 A1* | 2/2004 | Suzuki | 336/192 |
| 2012/0223797 A1 | 9/2012 | Won et al. | |
| 2013/0293992 A1* | 11/2013 | Duvvury et al. | 361/56 |
| 2014/0266507 A1* | 9/2014 | Fauer et al. | 333/181 |
| 2014/0300433 A1* | 10/2014 | Shudarek et al. | 333/177 |

* cited by examiner

CHOKE AND EMI FILTER WITH THE SAME

FIELD OF THE INVENTION

The present invention relates to a choke and an EMI filter with the choke, and more particularly to a choke and an EMI filter for receiving a dual-input power.

BACKGROUND OF THE INVENTION

With increasing development of science and technology, a variety of electrical appliances are frequently used. As known, power supply is necessary for normal operation of the electrical appliance. However, when AC power is supplied to the electrical appliance, the current provided by the AC power usually contains noise because of the power supply or the operations of some components (e.g. high-frequency transformers, stray capacitors or parasitic capacitors). The noise is also referred as electromagnetic Interference (EMI).

When an AC power is used, the generated noise includes differential mode noise or common mode noise may occur. An electromagnetic interference filter (also referred as an EMI filter) is used as a first defense line for protecting the power source from electromagnetic radiation. Generally, the EMI includes a choke and a capacitor. The choke is an inducting element for inhibiting noise generation. Moreover, the choke includes at least one winding coil, a magnetic core assembly, and a bobbin for winding the winding coil.

Generally, the EMI filter is equipped with a choke for suppressing the noise. The conventional EMI filter with a one-stage filtering function includes two filtering circuits for receiving a dual-input power (e.g. a first input power and a second input power). For suppressing the noise, the conventional EMI filter includes two independent chokes for receiving the dual-input power. The two chokes are connected with the two filtering circuits, respectively. Consequently, the corresponding choke can suppress the noise contained in the input power, which is received by each filtering circuit. However the use of the two chokes increases the fabricating cost of the EMI filter. Moreover, if the voltage values received by the two input terminals of the EMI filter are different, the current inputted into the positive terminal of each filtering circuit and the current outputted from the negative terminal of each filtering circuit are not equal. Meanwhile, the choke is in an unbalanced status and subject to saturation, and thus the impedance of the choke is very small. Consequently, the current flowing through the choke becomes very large. Under this circumstance, the possibility of burning out or damaging the components of the choke and EMI filter will be increased.

SUMMARY OF THE INVENTION

The present invention provides a choke and an EMI filter with the choke. In the choke of the present invention, four winding coils are directly wound around a single magnetic core assembly. When the choke is applied to the EMI filter for receiving a first input power and a second input power, the four winding coils of the choke are connected to different power transmission paths in order to receive the first input power and the second input power. As previously described, the conventional EMI filter needs two independent chokes to receive the first input power and the second input power and suppress the electromagnetic noise. In contrast, the EMI filter of the present invention uses only one choke to receive the first input power and the second input power and suppress the electromagnetic noise, so that the fabricating cost is reduced. Moreover, even if the voltage value of the first input power and the voltage value of the second input power are unbalanced and different, the saturation of the magnetic core assembly of the choke caused by the unbalance will be avoided. Consequently, the possibility of burning out or damaging the components of the choke and EMI filter will be minimized.

In accordance with an aspect of the present invention, there is provided a choke for an EMI filter. The EMI filter includes a first filtering circuit for receiving a first input power and a second filtering circuit for receiving a second input power. The choke includes a magnetic core assembly, a first winding coil, a second winding coil, a third winding coil, and a fourth winding coil. The magnetic core assembly includes a first magnetic core and a second magnetic core. The first winding coil and the second winding coil are directly wound around the first magnetic core. The third winding coil and the fourth winding coil are directly wound around the second magnetic core. The first winding coil is serially connected with a first positive path of the first filtering circuit. The second winding coil is serially connected with a second positive path of the second filtering circuit. The third winding coil is serially connected with a first negative path of the first filtering circuit. The fourth winding coil is serially connected with a second negative path of the second filtering circuit.

In accordance with another aspect of the present invention, there is provided an EMI filter. The EMI filter receives a first input power and a second input power. The EMI filter includes a first filtering circuit, a second filtering circuit, and a first choke. The first filtering circuit is used for suppressing electromagnetic interference of the first input power. The first filtering circuit includes a first positive path and a first negative path. The second filtering circuit is used for suppressing electromagnetic interference of the second input power. The second filtering circuit includes a second positive path and a second negative path. The first choke includes a first magnetic core assembly, a first winding coil and a second winding coil, a third winding coil, and a fourth winding coil. The first magnetic core assembly includes a first magnetic core and a second magnetic core. The first winding coil and the second winding coil are directly wound around the first magnetic core. The third winding coil and the fourth winding coil are directly wound around the second magnetic core. The first winding coil is serially connected with the first positive path. The second winding coil is serially connected with the second positive path. The third winding coil is serially connected with the first negative path. The fourth winding coil is serially connected with the second negative path.

In accordance with another aspect of the present invention, there is provided a choke for an EMI filter. The EMI filter includes a first filtering circuit for receiving a first input power and a second filtering circuit for receiving a second input power. The choke includes a first magnetic core assembly, a first winding coil, a second winding coil, a third winding coil, a fourth winding coil, a second magnetic core assembly, a fifth winding coil, a sixth winding coil, a seventh winding coil, and an eighth winding coil. The first magnetic core assembly includes a first magnetic core and a second magnetic core. The first winding coil and the second winding coil are directly wound around the first magnetic core. The third winding coil and the fourth winding coil are directly wound around the second magnetic core. The second magnetic core assembly includes a third magnetic core and a fourth magnetic core. The fifth winding coil and the sixth winding coil are directly wound around the third magnetic core. The seventh winding coil and the eighth winding coil are directly wound around the fourth magnetic core. The first winding coil and the fifth winding coil are serially connected with each other and connected to a first positive path of the first filtering circuit. The second winding coil and the sixth winding coil are serially connected with each other and connected to a second positive path of the second filtering circuit. The third winding coil and the seventh winding coil are serially connected with each other and connected to a first negative path of the first filtering circuit. The fourth winding coil and the eighth winding coil are serially connected with each other and connected to a second negative path of the second filtering circuit.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
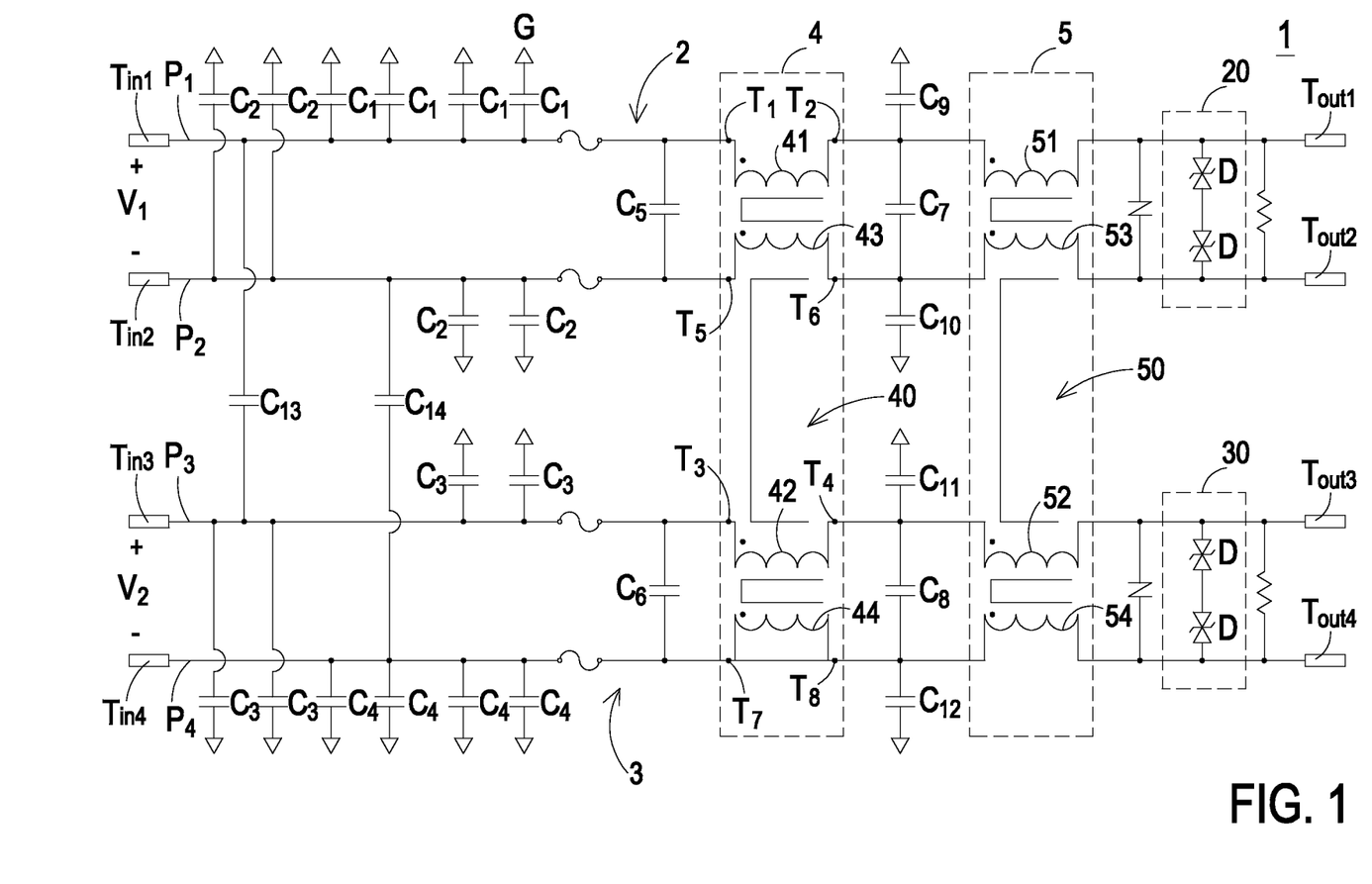
FIG. 1 is a schematic circuit diagram illustrating an EMI filter according to an embodiment of the present invention.
Figure 2A:
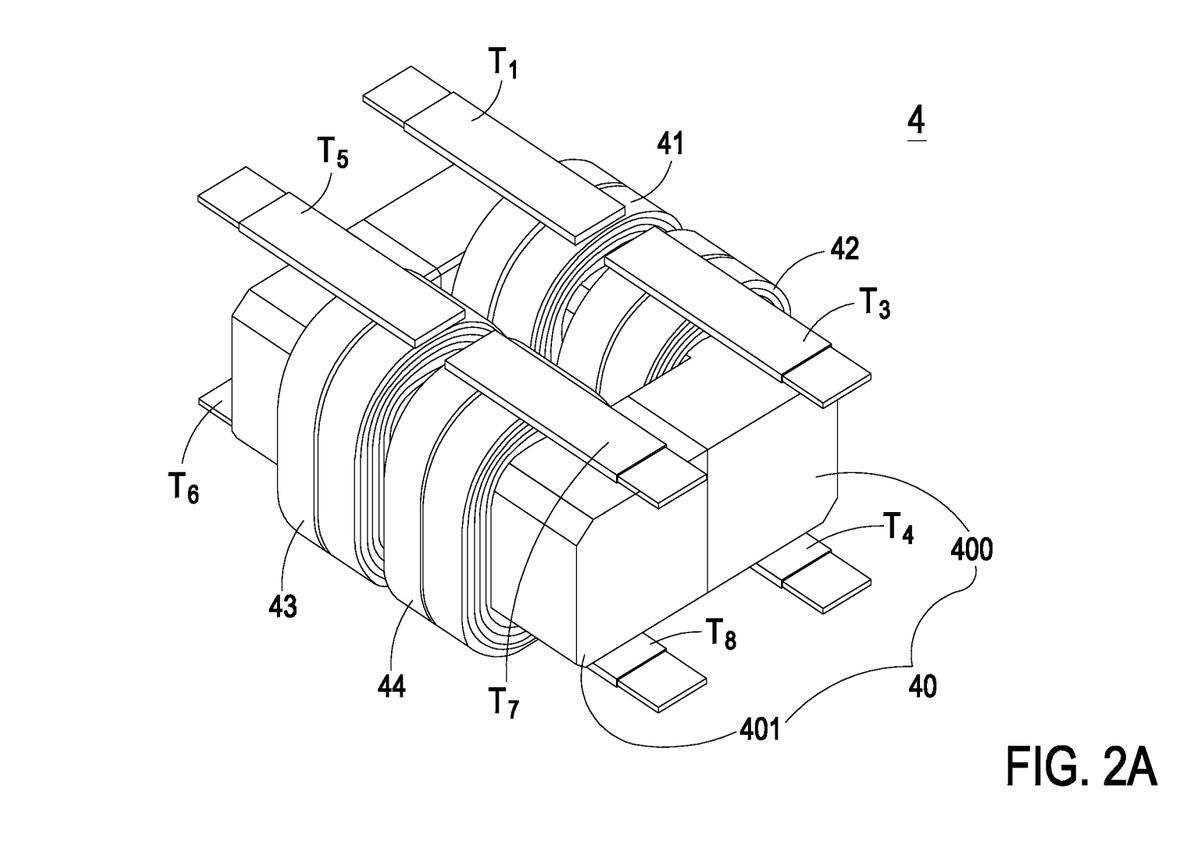
FIG. 2A is a schematic perspective view illustrating a choke used in the EMI filter of FIG. 1.
Figure 2B:
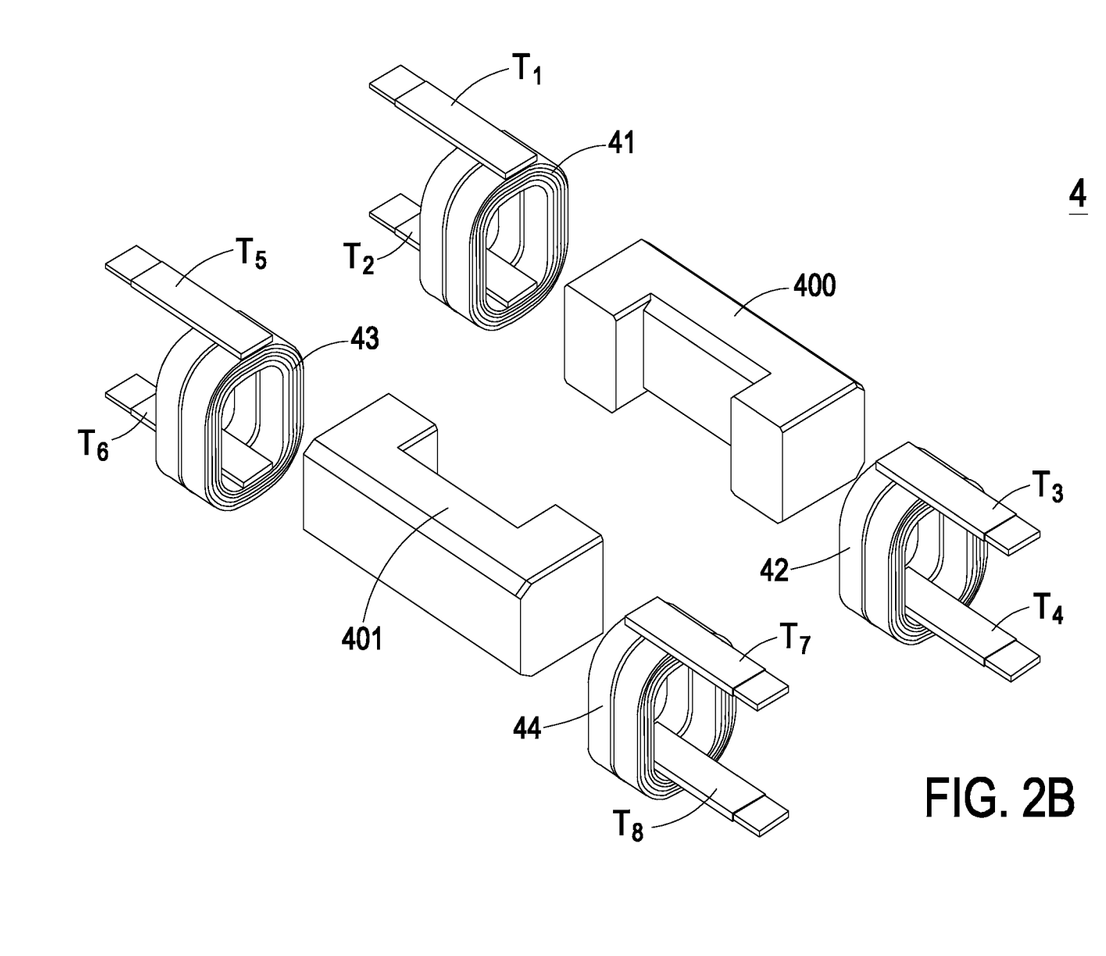
FIG. 2B is a schematic exploded view illustrating the choke of FIG. 2A.
Figure 2C:
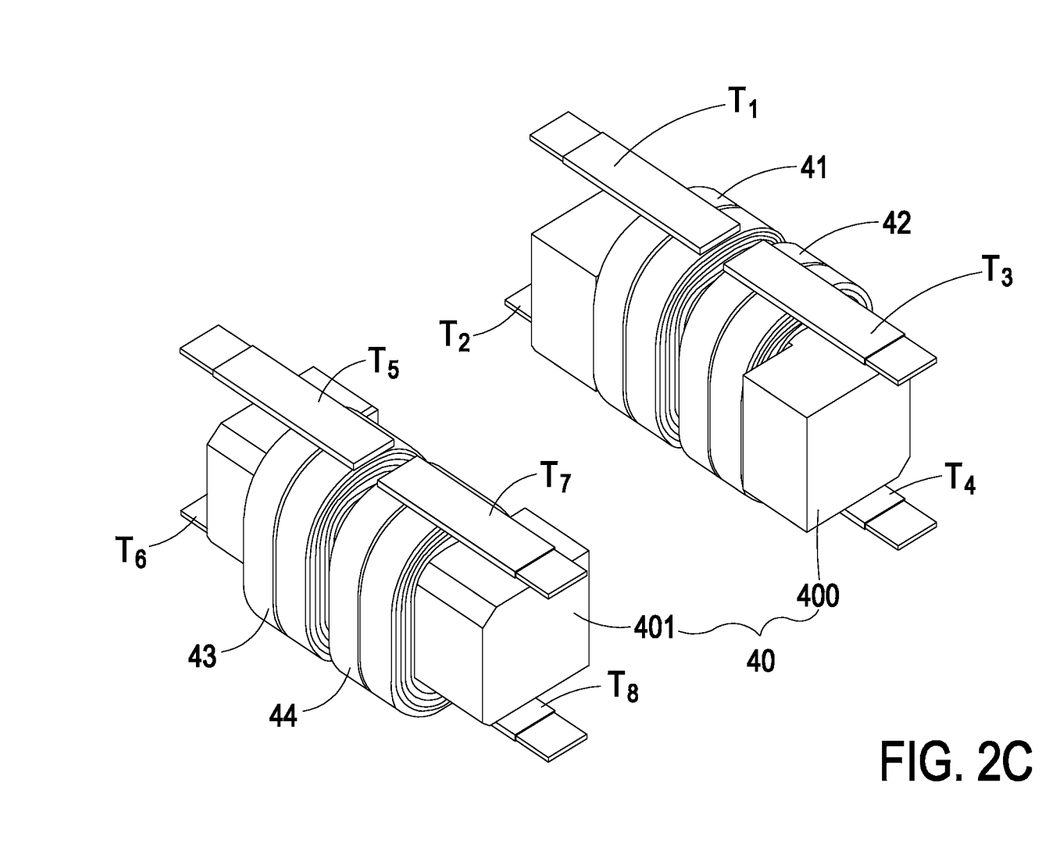
FIG. 2C schematically illustrates partially-assembled structures of the choke of FIG. 2A.

FIG. 1 is a schematic circuit diagram illustrating an EMI filter according to an embodiment of the present invention. FIG. 2A is a schematic perspective view illustrating a choke used in the EMI filter of FIG. 1. FIG. 2B is a schematic exploded view illustrating the choke of FIG. 2A. FIG. 2C schematically illustrates partially-assembled structures of the choke of FIG. 2A. Please refer to FIGS. 1 and 2A~2C. After a first input power $V_1$ and a second input power $V_2$ are received, the electromagnetic noise contained in the first input power $V_1$ and the electromagnetic noise contained in the second input power $V_2$ are filtered by the EMI filter 1. After the electromagnetic noise is filtered, the first input power $V_1$ and the second input power $V_2$ are provided to a power conversion circuit (not shown), which is connected to an output terminal of the EMI filter 1. In this embodiment, the EMI filter 1 includes a first filtering circuit 2, a second filtering circuit 3, and a first choke 4. The first filtering circuit 2 is used for filtering the electromagnetic noise of the first input power $V_1$. The first filtering circuit 2 includes a first positive path $P_1$ (i.e. a positive end power transmission path) and a first negative path $P_2$ (i.e. a negative end power transmission path). The first input power $V_1$ is received by the first filtering circuit 2 through a first positive input terminal $T_{in1}$ of the first positive path $P_1$ and a first negative input terminal $T_{in2}$ of the first negative path $P_2$. Consequently, the first input power $V_1$ is transmitted to the first choke 4 through the first positive path $P_1$ and the first negative path $P_2$. The second filtering circuit 3 is used for filtering the electromagnetic noise of the second input power $V_2$. The second filtering circuit 3 includes a second positive path $P_3$ and a second negative path $P_4$. The second input power $V_2$ is received by the second filtering circuit 3 through a second positive input terminal $T_{in3}$ of the second positive path $P_3$ and a second negative input terminal $T_{in4}$ of the second negative path $P_4$. Consequently, the second input power $V_2$ is transmitted to the first choke 4 through the second positive path $P_3$ and the second negative path $P_4$.

In this embodiment, the first choke 4 includes a first magnetic core assembly 40, a first winding coil 41, a second winding coil 42, a third winding coil 43, and a fourth winding coil 44. An example of the first magnetic core assembly 40 includes but is not limited to a UU-type magnetic core assembly. The first magnetic core assembly 40 includes a first magnetic core 400 and a second magnetic core 401. The first winding coil 41 and the second winding coil 42 are directly wound around the first magnetic core 400, and the first winding coil 41 and the second winding coil 42 are separated from each other. The third winding coil 43 and the fourth winding coil 44 are directly wound around the second magnetic core 401, and the third winding coil 43 and the fourth winding coil 44 are separated from each other. Moreover, the first winding coil 41 is serially connected with the first positive path $P_1$ of the first filtering circuit 2. The second winding coil 42 is serially connected with the second positive path $P_3$ of the second filtering circuit 3. The third winding coil 43 is serially connected with the first negative path $P_2$ of the first filtering circuit 2. The fourth winding coil 44 is serially connected with the second negative path $P_4$ of the second filtering circuit 3. In other words, a positive voltage of the first input power $V_1$ is received by the first winding coil 41, a positive voltage of the second input power $V_2$ is received by the second winding coil 42, a negative voltage of the first input power $V_1$ is received by the third winding coil 43, and a negative voltage of the second input power $V_2$ is received by the fourth winding coil 44.

In some embodiments, the first winding coil 41, the second winding coil 42, the third winding coil 43 and the fourth winding coil 44 are produced by winding copper sheets, but are not limited thereto. Consequently, the voltage-withstanding capability, the current-withstanding capacity and the heat-dissipating efficiency of these winding coils 41~44 are enhanced, and the first choke 4 can be applied to the circuit requesting high current or high power level. Preferably, the copper sheet has an outer insulation layer. Alternatively, the copper sheet is simultaneously wound together with an insulation sheet or an insulation tape attached thereon (not shown). Moreover, in the first choke 4, the first winding coil 41 and the second winding coil 42 are directly wound around the first magnetic core 400 of the first magnetic core assembly 40, and the third winding coil 43 and the fourth winding coil 44 are directly wound around the second magnetic core 401 of the first magnetic core assembly 40. In comparison with the conventional choke, the winding coils of the first choke 4 of the present invention are not wound around any bobbin. Since no bobbins are included in the first choke 4, the fabricating cost of the first choke 4 is reduced. Moreover, since no bobbins are included in the first choke 4, when the first choke 4 is applied to the circuit requesting high current or high power level, the problem of burning out the bobbins will be avoided.

In this embodiment, the first choke 4 further includes a plurality of independent pins. As shown in FIGS. 2A~2C, the first choke 4 includes eight independent pins $T_1$~$T_8$. The two independent pins $T_1$ and $T_2$ are connected with two outlet parts of the first winding coil 41, respectively. The two independent pins $T_3$ and $T_4$ are connected with two outlet parts of the second winding coil 42, respectively. The two independent pins $T_5$ and $T_6$ are connected with two outlet parts of the third winding coil 43, respectively. The two independent pins $T_7$ and $T_8$ are connected with two outlet parts of the fourth winding coil 44, respectively.

In this embodiment, the EMI filter 1 further includes at least one first filter capacitor $C_1$, at least one second filter capacitor $C_2$, at least one third filter capacitor $C_3$, and at least one fourth filter capacitor $C_4$. As shown in FIG. 1, the EMI filter 1 includes four first filter capacitors $C_1$, four second filter capacitors $C_2$, four third filter capacitors $C_3$, and four fourth filter capacitors $C_4$. A first end of the first filter capacitor $C_1$ is connected to the first positive path $P_1$ and arranged between the first winding coil 41 and the first positive input terminal $T_{in1}$. A second end of the first filter capacitor $C_1$ is connected to a common terminal G (e.g. a ground terminal). A first end of the second filter capacitor $C_2$ is connected to the first negative path $P_2$ and arranged between the third winding coil 43 and the first negative input terminal $T_{in2}$. A second end of the second filter capacitor $C_2$ is connected to the common terminal G A first end of the third filter capacitor $C_3$ is connected to the second positive path $P_3$ and arranged between the second winding coil 42 and the second positive input terminal $T_{in3}$. A second end of the third filter capacitor $C_3$ is connected to the common terminal G A first end of the fourth filter capacitor $C_4$ is connected to the second negative path $P_4$ and arranged between the fourth winding coil 44 and the second negative input terminal $T_{in4}$. A second end of the fourth filter capacitor $C_4$ is connected to the common terminal G These filter capacitors $C_1$~$C_4$ are used for filtering undesired frequencies.

Moreover, the EMI filter 1 further includes a fifth filter capacitor $C_5$ and a sixth filter capacitor $C_6$. A first end of the fifth filter capacitor $C_5$ is connected to the first positive path $P_1$ and arranged between the first positive input terminal $T_{in1}$ and the first winding coil 41. A second end of the fifth filter capacitor $C_5$ is connected to the first negative path $P_2$ and arranged between the first negative input terminal $T_{in2}$ and the third winding coil 43. A first end of the sixth filter capacitor $C_6$ is connected to the second positive path $P_3$ and arranged between the second positive input terminal $T_{in3}$ and the second winding coil 42. A second end of the sixth filter capacitor $C_6$ is connected to the second negative path $P_4$ and arranged between the second negative input terminal $T_{in4}$ and the fourth winding coil 44. The fifth filter capacitor $C_5$ and the sixth filter capacitor $C_6$ are used for filtering undesired frequencies.

As shown in FIG. 1, the EMI filter 1 further includes a second choke 5. The configurations of the second choke 5 are identical to those of the first choke 4. The second choke 5 includes a second magnetic core assembly 50 with two magnetic cores, a fifth winding coil 51, a sixth winding coil 52, a seventh winding coil 53, and an eighth winding coil 54. Like the first winding coil 41 and the second winding coil 42, the fifth winding coil 51 and the sixth winding coil 52 are separately wound around one magnetic core of the second magnetic core assembly 50. Like the third winding coil 43 and the fourth winding coil 44, the seventh winding coil 53 and the eighth winding coil 54 are separately wound around the other magnetic core of the second magnetic core assembly 50. Moreover, the fifth winding coil 51 is serially connected with the first positive path $P_1$ and the first winding coil 41, and the fifth winding coil 51 is connected between the first winding coil 41 and a first positive output terminal $T_{out1}$ of the first positive path $P_1$. The sixth winding coil 52 is serially connected with the second positive path $P_3$ and the second winding coil 42, and the sixth winding coil 52 is connected between the second winding coil 42 and a second positive output terminal $T_{out3}$ of the second positive path $P_3$. The seventh winding coil 53 is serially connected with the first negative path $P_2$ and the third winding coil 43, and the seventh winding coil 53 is connected between the third winding coil 43 and a first negative output terminal $T_{out2}$ of the first negative path $P_2$. The eighth winding coil 54 is serially connected with the second negative path $P_4$ and the fourth winding coil 44, and the eighth winding coil 54 is connected between the fourth winding coil 44 and a second negative output terminal $T_{out4}$ of the second negative path $P_4$. Since the configurations of the second choke 5 are identical to those of the first choke 4, the detailed structures of the second choke 5 are not redundantly described herein. Since the first choke 4 and the second choke 5 are included in the EMI filter 1, the EMI filter 1 has a two-stage filtering function.

In some other embodiments, the EMI filter 1 further includes a seventh filter capacitor $C_7$ and an eighth filter capacitor $C_8$. A first end of the seventh filter capacitor $C_7$ is connected to the first positive path $P_1$ and arranged between the first winding coil 41 and the fifth winding coil 51. A second end of the seventh filter capacitor $C_7$ is connected to the first negative path $P_2$ and arranged between the third winding coil 43 and the seventh winding coil 53. A first end of the eighth filter capacitor $C_8$ is connected to the second positive path $P_3$ and arranged between the second winding coil 42 and the sixth winding coil 52. A second end of the eighth filter capacitor $C_8$ is connected to the second negative path $P_4$ and arranged between the fourth winding coil 44 and the eighth winding coil 54. The seventh filter capacitor $C_7$ and the eighth filter capacitor $C_8$ are used for filtering undesired frequencies.

The EMI filter 1 further includes a ninth filter capacitor $C_9$, a tenth filter capacitor $C_{10}$, an eleventh filter capacitor $C_{11}$, and a twelfth filter capacitor $C_{12}$. A first end of the ninth filter capacitor $C_9$ is connected to the first positive path $P_1$ and arranged between the first winding coil 41 and the fifth winding coil 51. A second end of the ninth filter capacitor $C_9$ is connected to the common terminal G. A first end of the tenth filter capacitor $C_{10}$ is connected to the first negative path $P_2$ and arranged between the third winding coil 43 and the seventh winding coil 53. A second end of the tenth filter capacitor $C_{10}$ is connected to the common terminal G. A first end of the eleventh filter capacitor $C_{11}$ is connected to the second positive path $P_3$ and arranged between the second winding coil 42 and the sixth winding coil 52. A second end of the eleventh filter capacitor $C_{11}$ is connected to the common terminal G A first end of the twelfth filter capacitor $C_{12}$ is connected to the second negative path $P_4$ and arranged between the fourth winding coil 44 and the eighth winding coil 54. A second end of the twelfth filter capacitor $C_{12}$ is connected to the common terminal G. The ninth filter capacitor $C_9$, the tenth filter capacitor $C_{10}$, the eleventh filter capacitor $C_{11}$ and the twelfth filter capacitor $C_{12}$ are used for filtering undesired frequencies.

From the above discussions about the first choke 4, the first winding coil 41 and the second winding coil 42 are directly wound around the first magnetic core 400 of the first magnetic core assembly 40, the third winding coil 43 and the fourth winding coil 44 are directly wound around the second magnetic core 401 of the first magnetic core assembly 40. Consequently, the EMI filter 1 for receiving the first input power $V_1$ and the second input power $V_2$ only has to use a single first choke 4. In the first choke 4, the first positive path $P_1$ of the first filtering circuit 2 is connected with the first winding coil 41, the first negative path $P_2$ of the first filtering circuit 2 is connected with the third winding coil 43, the second positive path $P_3$ of the second filtering circuit 3 is connected with the second winding coil 42, and the second negative path $P_4$ is connected with the fourth winding coil 44 in order to suppress the electromagnetic noise. As previously described, the conventional EMI filter with a one-stage filtering function needs two independent chokes to receive the first input power and the second input power and suppress the electromagnetic noise. In contrast, the EMI filter of the present invention uses only one choke to receive the first input power and the second input power and suppress the electromagnetic noise. In comparison with the conventional EMI filter using two magnetic core assemblies, the EMI filter of the present invention needs only one magnetic core assembly. Moreover, in the first choke 4, the first winding coil 41, the second winding coil 42, the third winding coil 43 and the fourth winding coil 44 are directly wound around the first magnetic core assembly 40. Consequently, the first input power $V_1$ and the second input power $V_2$ are received by the first winding coil 41, the second winding coil 42, the third winding coil 43 and the fourth winding coil 44. Even if the voltage value of the first input power $V_1$ and the voltage value of the second input power $V_2$ are unbalanced and different, the electric power inputted from the positive input terminals of the EMI filter 1 into the single first magnetic core assembly 40 is substantially equal to the sum of the first input power $V_1$ and the second input power $V_2$. In addition, the electric power outputted from the single first magnetic core assembly 40 to the negative input terminals of the EMI filter is substantially equal to the sum of the first input power $V_1$ and the second input power $V_2$. Consequently, the saturation of the first magnetic core assembly 40 caused by the unbalance between the voltage value of the first input power $V_1$ and the voltage value of the second input power $V_2$ will be avoided. Consequently, the possibility of burning out or damaging the components of the first choke 4 and EMI filter 1 will be minimized.

Figure 3:
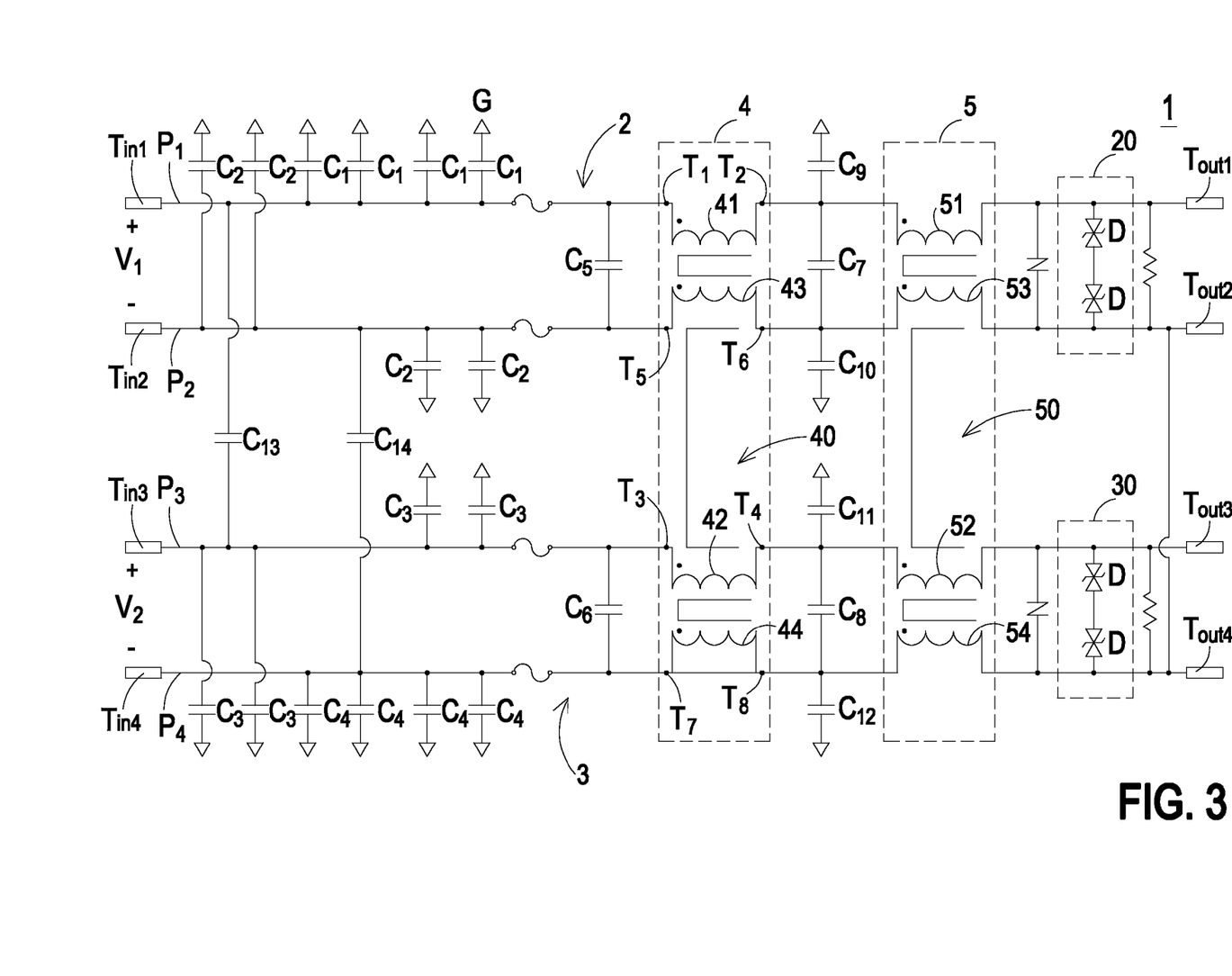
FIG. 3 is a schematic circuit diagram illustrating a variant example of the EMI filter of FIG. 1.

FIG. 3 is a schematic circuit diagram illustrating a variant example of the EMI filter of FIG. 1. In this embodiment, the first negative output terminal $T_{out2}$ of the first negative path $P_2$ and the second negative output terminal $T_{out4}$ of the second negative path $P_4$ are connected with each other (i.e. in a short-circuited status). Under this circumstance, the first filtering circuit 2 and the second filtering circuit 3 are not independent of each other. In case that the voltage value of the first input power $V_1$ received by the first filtering circuit 2 is insufficient, the voltage value of the second input power $V_2$ received by the second filtering circuit 3 may be shared to the first filtering circuit 2. Similarly, in case that the voltage value of the second input power $V_2$ received by the second filtering circuit 3 is insufficient, the voltage value of the first input power $V_1$ received by the first filtering circuit 2 may be shared to the second filtering circuit 3.

Please refer to FIGS. 1 and 3 again. In case that the voltage value of the first input power $V_1$ and the voltage value of the second input power $V_2$ are unbalanced and different, the EMI filter 1 further includes a first across-the-line capacitor $C_{13}$ and a second across-the-line capacitor $C_{14}$ for enhancing the filtering efficacy. The first across-the-line capacitor $C_{13}$ is connected between the first positive path $P_1$ of the first filtering circuit 2 and the second positive path $P_3$ of the second filtering circuit 3. That is, a first end and a second end of the first across-the-line capacitor $C_{13}$ are connected with the first positive path $P_1$ and the second positive path $P_3$, respectively. The second across-the-line capacitor $C_{14}$ is connected between the first negative path $P_2$ of the first filtering circuit 2 and the second negative path $P_4$ of the second filtering circuit 3. That is, a first end and a second end of the second across-the-line capacitor $C_{14}$ are connected with the first negative path $P_2$ and the second negative path $P_4$, respectively.

In the above embodiments, the filter capacitors $C_1$-$C_4$ and the filter capacitors $C_9$~$C_{12}$ cooperate with the first choke 4 and/or the second choke 5 in order to suppress the common mode noise (e.g. the 30 MHz~50 MHz noise). The filter capacitors $C_5$~$C_8$, the first across-the-line capacitor $C_{13}$ and the second across-the-line capacitor $C_{14}$ are used for suppressing the differential mode noise (e.g. the 150 KHz~10 MHz noise). Moreover, the capacitance values of the filter capacitors $C_5$~$C_8$, the first across-the-line capacitor $C_{13}$ and the second across-the-line capacitor $C_{14}$ are much higher than the capacitance values of the filter capacitors $C_1$~$C_4$ and the filter capacitors $C_9$~$C_{12}$.

Please refer to FIGS. 1 and 3 again. The first filtering circuit 2 further includes a transient voltage suppressing circuit 20, and the second filtering circuit 3 further includes a transient voltage suppressing circuit 30. The transient voltage inhibiting circuit 20 is connected between the first positive path $P_1$ and the first negative path $P_2$, and connected between the first positive output terminal $T_{out1}$ and the first negative output terminal $T_{out2}$. The transient voltage suppressing circuit 30 is connected between the second positive path $P_3$ and the second negative path $P_4$, and connected between the second positive output terminal $T_{out3}$ and the second negative output terminal $T_{out4}$. Each of the transient voltage inhibiting circuits 20 and 30 includes two serially-connected transient voltage suppressors (TVS) D in order to suppress surge. In case that the first input power $V_1$ and the second input power $V_2$ are stably inputted into the EMI filter 1, the transient voltage inhibiting circuits 20 and 30 have high impedance values with respect to the EMI filter 1. In case that the first input power $V_1$ and the second input power $V_2$ are abruptly increased and the surge occurs, the impedance values of the transient voltage inhibiting circuits 20 and 30 are quickly decreased and the transient voltage inhibiting circuits 20 and 30 are in a short-circuited status. Consequently, a low impedance path is provided to dissipate away the current of the surge. Under this circumstance, the influence of the surge on the EMI filter 1 is eliminated, and the purpose of protecting the EMI filter 1 is achieved.

Figure 4A:
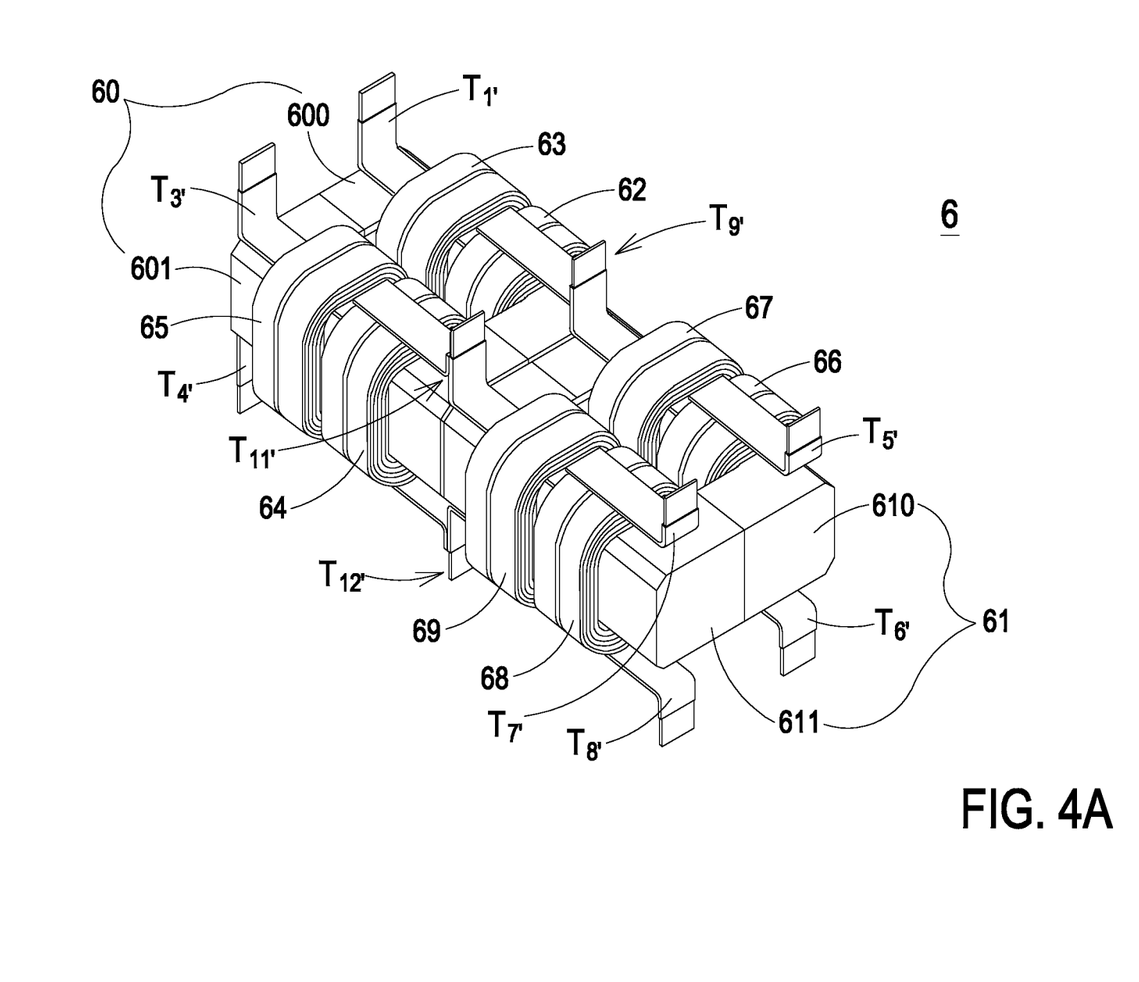
FIG. 4A is a schematic perspective view illustrating another exemplary choke used in the EMI filter of FIG. 1.
Figure 4B:
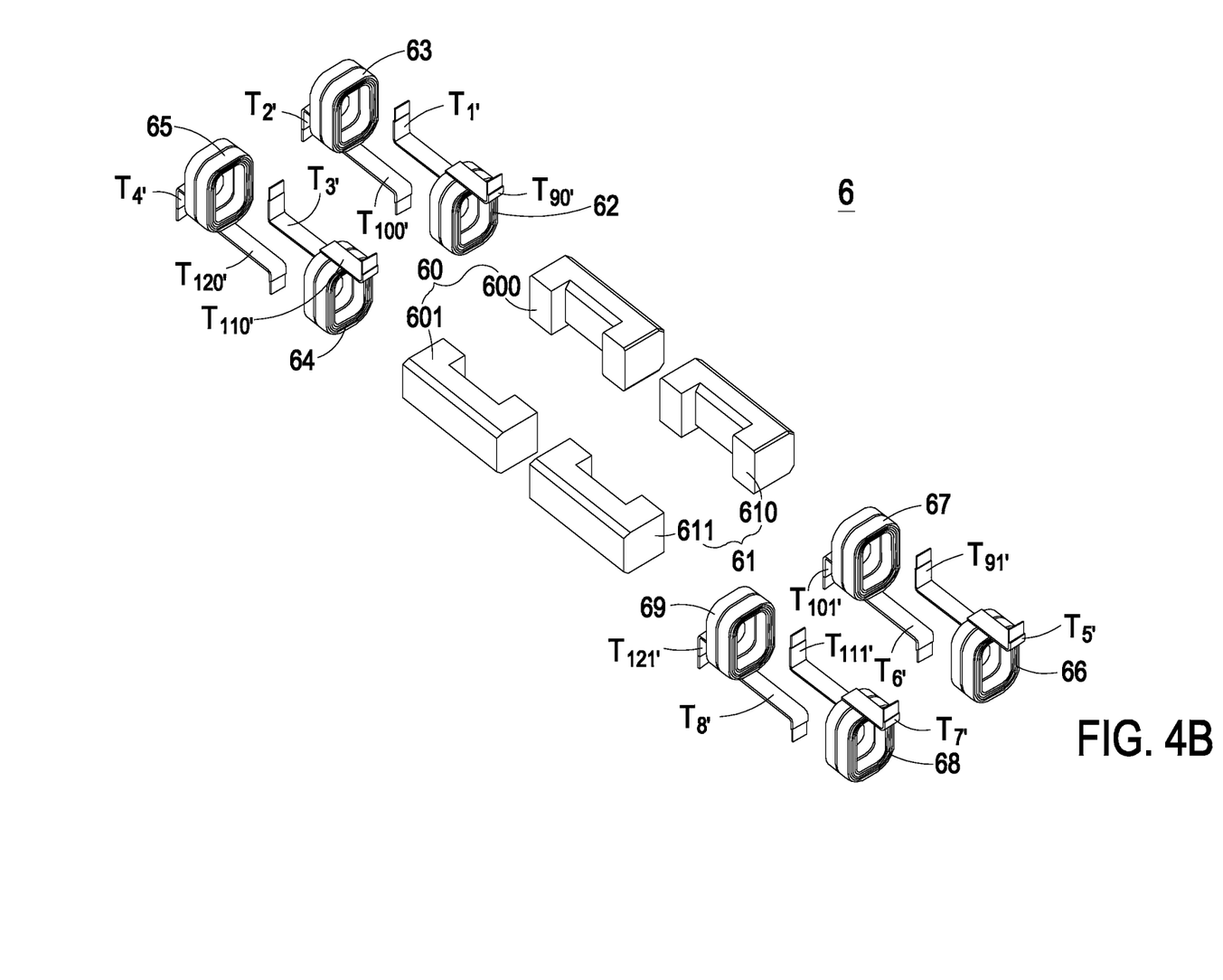
FIG. 4B is a schematic exploded view illustrating the choke of FIG. 4A.
Figure 4C:
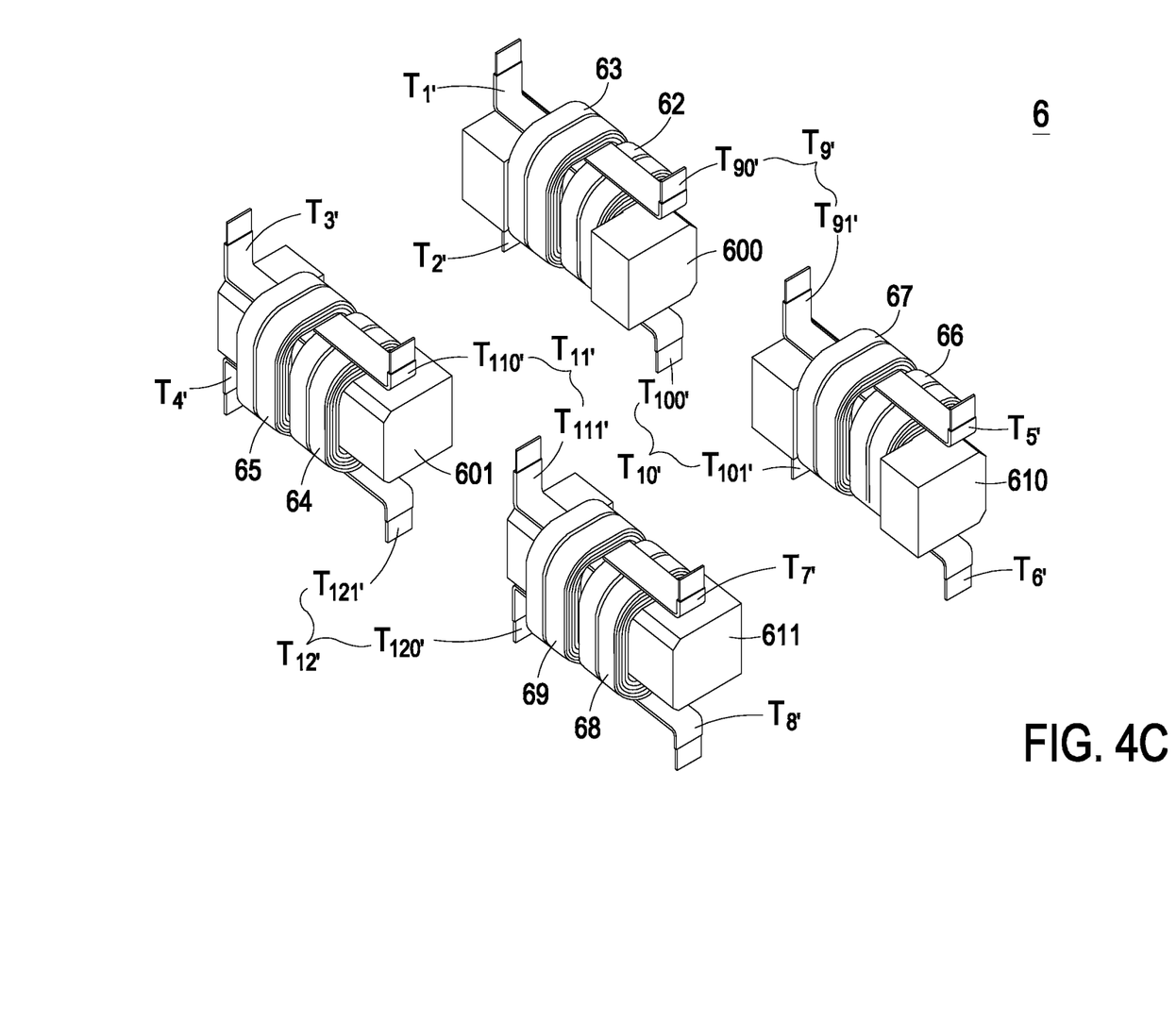
FIG. 4C schematically illustrates partially-assembled structures of the choke of FIG. 4A.

FIG. 4A is a schematic perspective view illustrating another exemplary choke used in the EMI filter of FIG. 1. FIG. 4B is a schematic exploded view illustrating the choke of FIG. 4A. FIG. 4C schematically illustrates partially-assembled structures of the choke of FIG. 4A. Please refer to FIGS. 4A~4C. The choke 6 includes a first magnetic core assembly 60, a second magnetic core assembly 61, a first winding coil 62, a second winding coil 63, a third winding coil 64, a fourth winding coil 65, a fifth winding coil 66, a sixth winding coil 67, a seventh winding coil 68, and an eighth winding coil 69. Examples of the first magnetic core assembly 60 and the second magnetic core assembly 61 includes but are not limited to UU-type magnetic core assemblies. The first magnetic core assembly 60 includes a first magnetic core 600 and a second magnetic core 601. The second magnetic core assembly 61 includes a third magnetic core 610 and a fourth magnetic core 611. The first winding coil 61 and the second winding coil 62 are directly wound around the first magnetic core 600, and the first winding coil 61 and the second winding coil 62 are separated from each other. The third winding coil 63 and the fourth winding coil 64 are directly wound around the second magnetic core 601, and the third winding coil 63 and the fourth winding coil 64 are separated from each other. The fifth winding coil 66 and the sixth winding coil 67 are directly wound around the third magnetic core 610, and the fifth winding coil 66 and the sixth winding coil 67 are separated from each other. The seventh winding coil 68 and the eighth winding coil 69 are directly wound around the fourth magnetic core 611, and the seventh winding coil 68 and the eighth winding coil 69 are separated from each other.

As shown in FIGS. 4A~4C, the choke 6 further includes a plurality of independent pins (e.g. eight independent pins $T_{1'}$~$T_{8'}$) and a plurality of shared pins (e.g. four shared pins $T_{9'}$-$T_{12'}$). The independent pin $T_{1'}$ is connected with a first outlet part of the first winding coil 62. The independent pin $T_{2'}$ is connected with a first outlet part of the second winding coil 63. The independent pin $T_{3'}$ is connected with a first outlet part of the third winding coil 64. The independent pin $T_{4'}$ is connected with a first outlet part of the fourth winding coil 65. The independent pin $T_{5'}$ is connected with a first outlet part of the fifth winding coil 66. The independent pin $T_{6'}$ is connected with a first outlet part of the sixth winding coil 67. The independent pin $T_{7'}$ is connected with a first outlet part of the seventh winding coil 68. The independent pin $T_{8'}$ is connected with a first outlet part of the eighth winding coil 69. The shared pin $T_{9'}$ is connected with a second outlet part of the first winding coil 62 and a second outlet part of the fifth winding coil 66. The shared pin $T_{10'}$ is connected with a second outlet part of the second winding coil 63 and a second outlet part of the sixth winding coil 67. The shared pin $T_{11'}$ is connected with a second outlet part of the third winding coil 64 and a second outlet part of the seventh winding coil 68. The shared pin $T_{12'}$ is connected with a second outlet part of the fourth winding coil 65 and a second outlet part of the eighth winding coil 69.

In the above embodiment, the shared pin $T_{9'}$ is composed of two sub-pins $T_{90'}$ and $T_{91'}$, the shared pin $T_{10'}$ is composed of two sub-pins $T_{100'}$ and $T_{101'}$, the shared pin $T_{11'}$ is composed of two sub-pins $T_{110'}$ and $T_{111'}$, and the shared pin $T_{12'}$ is composed of two sub-pins $T_{120'}$ and $T_{121'}$. The two sub-pins $T_{90'}$ and $T_{91'}$ of the shared pin $T_{9'}$ are connected with the second outlet part of the first winding coil 62 and the second outlet part of the fifth winding coil 66, respectively. The sub-pins $T_{100'}$ and $T_{101'}$ of the shared pin $T_{10'}$ are connected with the second outlet part of the second winding coil 63 and the second outlet part of the sixth winding coil 67, respectively. The $T_{110'}$ and $T_{111'}$ of the shared pin $T_{11'}$ are connected with the second outlet part of the third winding coil 64 and the second outlet part of the seventh winding coil 68, respectively. The $T_{120'}$ and $T_{121'}$ of the shared pin $T_{12'}$ are connected with the second outlet part of the fourth winding coil 65 and the second outlet part of the eighth winding coil 69, respectively.

Figure 5:
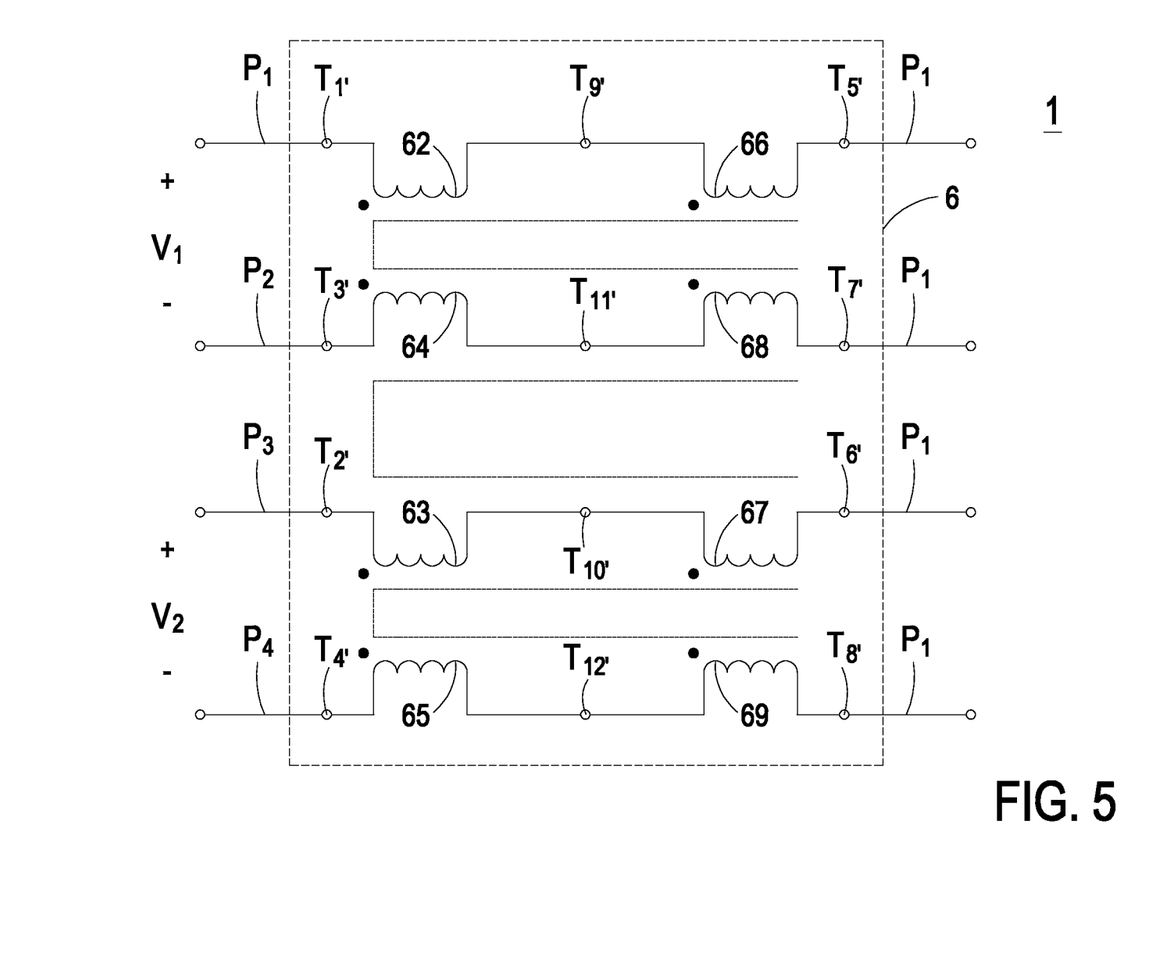
FIG. 5 is a schematic circuit diagram illustrating a portion of the EMI filter including the choke of FIG. 4A.

The first choke 4 and the second choke 5 used in the EMI filter of FIG. 1 may be replaced by the choke 6 of FIG. 4A. Hereinafter, the relationships between the choke 6 and associated components of the EMI filter 1 will be illustrated with reference to FIG. 5. FIG. 5 is a schematic circuit diagram illustrating a portion of the EMI filter including the choke of FIG. 4A. Components and elements corresponding to those of FIG. 1 are designated by identical numeral references, and detailed descriptions thereof are omitted. The first winding coil 41 and the fifth winding coil 66 are serially connected with each other, and connected to the first positive path $P_1$ of the first filtering circuit 2. The second winding coil 63 and the sixth winding coil 67 are serially connected with each other, and connected to the second positive path $P_3$ of the second filtering circuit 3. The third winding coil 64 and the seventh winding coil 68 are serially connected with each other, and connected to the first negative path $P_2$ of the first filtering circuit 2. The fourth winding coil 65 and the eighth winding coil 69 are serially connected with each other, and connected to the second negative path $P_4$ of the second filtering circuit 3.

From the above discussions, the choke 6 includes two magnetic core assemblies 60, 61 and eight winding coils 62~69. The winding coils 62~65 are wound around the first magnetic core assembly 60. The winding coils 66~69 are wound around the second magnetic core assembly 61. When the choke 6 is included in the EMI filter 1, the EMI filter 1 has the two-stage filtering function. In other words, the two-stage filtering function provided by the choke 6 in the EMI filter of FIG. 5 is identical to the two-stage filtering function caused by the first choke 4 and the second choke 5 in the EMI filter of FIG. 1. Moreover, since the choke 6 is a single component, the installation of the choke 6 is more convenient than the installation of the two components (i.e. the first choke 4 and the second choke 5). Since each of the first choke 4 and the second choke 5 has eight independent pins, the first choke 4 and the second choke 5 have a total of sixteen independent pins. Whereas, since the choke 6 includes eight independent pins and four shared pins, the choke 6 has a total of twelve pins. In other words, the installation of the choke 6 is more convenient.

From the above descriptions, the present invention provides a choke and an EMI filter with the choke. In the choke of the present invention, four winding coils are directly wound around a single magnetic core assembly. When the choke is applied to the EMI filter for receiving a first input power and a second input power, the four winding coils of the choke are connected to different power transmission paths in order to receive the first input power and the second input power. As previously described, the conventional EMI filter needs two independent chokes to receive the first input power and the second input power and suppress the electromagnetic noise. In contrast, the EMI filter of the present invention uses only one choke to receive the first input power and the second input power and suppress the electromagnetic noise, so that the fabricating cost is reduced. Moreover, even if the voltage value of the first input power and the voltage value of the second input power are unbalanced and different, the saturation of the first magnetic core assembly of the choke caused by the unbalance will be avoided. Consequently, the possibility of burning out or damaging the components of the choke and EMI filter will be minimized.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A choke for an EMI filter, the EMI filter comprising a first filtering circuit for receiving a first input power and a second filtering circuit for receiving a second input power, the choke comprising:
a magnetic core assembly comprising a first magnetic core and a second magnetic core, wherein the first magnetic core is in physical contact with the second magnetic core;
a first winding coil and a second winding coil directly wound around the first magnetic core; and
a third winding coil and a fourth winding coil directly wound around the second magnetic core,
wherein the first winding coil, the second winding coil, the third winding coil and the fourth winding coil are coupled to each other through the magnetic core assembly, and the first winding coil, the second winding coil, the third winding coil, the fourth winding coil and the magnetic core assembly are formed as a single choke,
wherein the first winding coil is serially connected with a first positive path of the first filtering circuit, the second winding coil is serially connected with a second positive path of the second filtering circuit, the third winding coil is serially connected with a first negative path of the first filtering circuit, and the fourth winding coil is serially connected with a second negative path of the second filtering circuit.

2. The choke according to claim 1, wherein the first input power is received and transmitted by the first positive path and the first negative path of the first filtering circuit, and the second input power is received and transmitted by the second positive path and the second negative path of the second filtering circuit.

3. The choke according to claim 1, wherein the magnetic core assembly is a UU-type magnetic core assembly.

4. The choke according to claim 1, wherein the first winding coil, the second winding coil, the third winding coil and the fourth winding coil are copper sheets, wherein the copper sheet of each of the first-fourth winding coils has an outer insulation layer, or the copper sheet of each of the first-fourth winding coils is simultaneously wound together with an insulation sheet or an insulation tape.

5. The choke according to claim 1, further comprising eight independent pins, wherein two outlet parts of each of the first winding coil, the second winding coil, the third winding coil and the fourth winding coil are connected with corresponding two independent pins of the eight independent pins, respectively.

6. An EMI filter for receiving a first input power and a second input power, the EMI filter comprising:
a first filtering circuit for suppressing electromagnetic interference of the first input power, wherein the first filtering circuit comprises a first positive path and a first negative path;
a second filtering circuit for suppressing electromagnetic interference of the second input power, wherein the second filtering circuit comprises a second positive path and a second negative path; and
a first choke comprising:
a first magnetic core assembly comprising a first magnetic core and a second magnetic core, wherein the first magnetic core is in physical contact with the second magnetic core;
a first winding coil and a second winding coil directly wound around the first magnetic core; and
a third winding coil and a fourth winding coil directly wound around the second magnetic core,
wherein the first winding coil, the second winding coil, the third winding coil and the fourth winding coil are coupled to each other through the first magnetic core assembly, and the first winding coil, the second winding coil, the third winding coil, the fourth winding coil and the first magnetic core assembly are formed as a single choke,
wherein the first winding coil is serially connected with the first positive path, the second winding coil is serially connected with the second positive path, the third winding coil is serially connected with the first negative path, and the fourth winding coil is serially connected with the second negative path.

7. The EMI filter according to claim 6, wherein the first input power is received by the first filtering circuit through a first positive input terminal of the first positive path and a first negative input terminal of the first negative path, and the second input power is received by the second filtering circuit through a second positive input terminal of the second positive path and a second negative input terminal of the second negative path.

8. The EMI filter according to claim 7, further comprising:
at least one first filter capacitor, wherein a first end of the first filter capacitor is connected to the first positive path and arranged between the first winding coil and the first positive input terminal, and a second end of the first filter capacitor is connected to a common terminal;
at least one second filter capacitor, wherein a first end of the second filter capacitor is connected to the first negative path and arranged between the third winding coil and the first negative input terminal, and a second end of the second filter capacitor is connected to the common terminal;
at least one third filter capacitor, wherein a first end of the third filter capacitor is connected to the second positive path and arranged between the second winding coil and the second positive input terminal, and a second end of the third filter capacitor is connected to the common terminal; and
at least one fourth filter capacitor, wherein a first end of the fourth filter capacitor is connected to the second negative path and arranged between the fourth winding coil and the second negative input terminal, and a second end of the fourth filter capacitor is connected to the common terminal.

9. The EMI filter according to claim 7, further comprising:
a fifth filter capacitor, wherein a first end of the fifth filter capacitor is connected to the first positive path and arranged between the first positive input terminal and the first winding coil, and a second end of the fifth filter capacitor is connected to the first negative path and arranged between the first negative input terminal and the third winding coil; and
a sixth filter capacitor, wherein a first end of the sixth filter capacitor is connected to the second positive path and arranged between the second positive input terminal and the second winding coil, and a second end of the sixth filter capacitor is connected to the second negative path and arranged between the second negative input terminal and the fourth winding coil.

10. The EMI filter according to claim 6, further comprising a second choke, wherein the second choke comprises:

a second magnetic core assembly comprising two magnetic cores;
a fifth winding coil and a sixth winding coil directly wound around one magnetic core of the second magnetic core assembly; and
a seventh winding coil and an eighth winding coil directly wound around the other magnetic core of the second magnetic core,
wherein the fifth winding coil is serially connected with the first positive path, the sixth winding coil is serially connected with the second positive path, the seventh winding coil is serially connected with the first negative path, and the eighth winding coil is serially connected with the second negative path.

11. The EMI filter according to claim 10, wherein the fifth winding coil is connected between the first winding coil and a first positive output terminal of the first positive path, the sixth winding coil is connected between the second winding coil and a second positive output terminal of the second positive path, the seventh winding coil is connected between the third winding coil and a first negative output terminal of the first negative path, and the eighth winding coil is connected between the fourth winding coil and a second negative output terminal of the second negative path.

12. The EMI filter according to claim 10, further comprising:
a seventh filter capacitor, wherein a first end of the seventh filter capacitor is connected to the first positive path and arranged between the first winding coil and the fifth winding coil, and a second end of the seventh filter capacitor is connected to the first negative path and arranged between the third winding coil and the seventh winding coil; and
an eighth filter capacitor, wherein a first end of the eighth filter capacitor is connected to the second positive path and arranged between the second winding coil and the sixth winding coil, and a second end of the eighth filter capacitor is connected to the second negative path and arranged between the fourth winding coil and the eighth winding coil.

13. The EMI filter according to claim 10, further comprising:
a ninth filter capacitor, wherein a first end of the ninth filter capacitor is connected to the first positive path and arranged between the first winding coil and the fifth winding coil, and a second end of the ninth filter capacitor is connected to a common terminal;
a tenth filter capacitor, wherein a first end of the tenth filter capacitor is connected to the first negative path and arranged between the third winding coil and the seventh winding coil, and a second end of the tenth filter capacitor is connected to the common terminal;
an eleventh filter capacitor, wherein a first end of the eleventh filter capacitor is connected to the second positive path and arranged between the second winding coil and the sixth winding coil, and a second end of the eleventh filter capacitor is connected to the common terminal; and
a twelfth filter capacitor, wherein a first end of the twelfth filter capacitor is connected to the second negative path and arranged between the fourth winding coil and the eighth winding coil, and a second end of the twelfth filter capacitor is connected to the common terminal.

14. The EMI filter according to claim 6, wherein the first negative path and the second negative path are connected with each other.

15. The EMI filter according to claim 6, further comprising:
a first across-the-line capacitor connected between the first positive path and the second positive path; and
a second across-the-line capacitor connected between the first negative path and the second negative path.

16. The EMI filter according to claim 6, wherein the first filtering circuit further comprises a first transient voltage suppressing circuit, and the second filtering circuit further comprises a second transient voltage suppressing circuit, wherein the first transient voltage suppressing circuit is connected between the first positive path and the first negative path, and the second transient voltage suppressing circuit is connected between the second positive path and the second negative path.

17. The EMI filter according to claim 16, wherein each of the first transient voltage suppressing circuit and the second transient voltage suppressing circuit comprises two serially-connected transient voltage suppressors.

18. A choke for an EMI filter, the EMI filter comprising a first filtering circuit for receiving a first input power and a second filtering circuit for receiving a second input power, the choke comprising:
a first magnetic core assembly comprising a first magnetic core and a second magnetic core, wherein the first magnetic core is in physical contact with the second magnetic core;
a first winding coil and a second winding coil directly wound around the first magnetic core;
a third winding coil and a fourth winding coil directly wound around the second magnetic core;
a second magnetic core assembly comprising a third magnetic core and a fourth magnetic core, wherein the third magnetic core is in physical contact with the fourth magnetic core;
a fifth winding coil and a sixth winding coil directly wound around the third magnetic core; and
a seventh winding coil and an eighth winding coil directly wound around the fourth magnetic core,
wherein the first winding coil, the second winding coil, the third winding coil, the fourth winding coil, the fifth winding coil, the sixth winding coil, the seventh winding coil and the eighth winding coil are coupled to each other through the first magnetic core assembly and the second magnetic core assembly, and the first winding coil, the second winding coil, the third winding coil, the fourth winding coil, the fifth winding coil, the sixth winding coil, the seventh winding coil, the eighth winding coil, the first magnetic core assembly and the second magnetic core assembly are formed as a single choke,
wherein the first magnetic core assembly is in physical contact with the second magnetic core assembly, the first winding coil and the fifth winding coil are serially connected with each other and connected to a first positive path of the first filtering circuit, the second winding coil and the sixth winding coil are serially connected with each other and connected to a second positive path of the second filtering circuit, the third winding coil and the seventh winding coil are serially connected with each other and connected to a first negative path of the first filtering circuit, and the fourth winding coil and the eighth winding coil are serially connected with each other and connected to a second negative path of the second filtering circuit.

19. The choke according to claim 18, further comprising a first shared pin, a second shared pin, a third shared pin and a fourth shared pin, wherein the first shared pin is connected with an end of the first winding coil and an end of the fifth winding coil, the second shared pin is connected with an end of the second winding coil and an end of the sixth winding coil, the third shared pin is connected with an end of the third winding coil and an end of the seventh winding coil, and the fourth shared pin is connected with an end of the fourth winding coil and an end of the eighth winding coil.

20. The choke according to claim 19, further comprising a first independent pin, a second independent pin, a third independent pin, a fourth independent pin, a fifth independent pin, a sixth independent pin, a seventh independent pin and an eighth independent pin, wherein the first independent pin is connected with the other end of the first winding coil, the second independent pin is connected with the other end of the second winding coil, the third independent pin is connected with the other end of the third winding coil, the fourth independent pin is connected with the other end of the fourth winding coil, the fifth independent pin is connected with the other end of the fifth winding coil, the sixth independent pin is connected with the other end of the sixth winding coil, the seventh independent pin is connected with the other end of the seventh winding coil, and the eighth independent pin is connected with the other end of the eighth winding coil.

* * * * *